(12) United States Patent
Chou

(10) Patent No.: US 6,250,083 B1
(45) Date of Patent: Jun. 26, 2001

(54) DEHUMIDIFIER

(76) Inventor: Ching-Lung Chou, 58, Ma Yuan West St., Taichung (TW)

( * ) Notice: Subject to any disclaimer, the term of this patent is extended or adjusted under 35 U.S.C. 154(b) by 0 days.

(21) Appl. No.: 09/546,149

(22) Filed: Apr. 5, 2000

(51) Int. Cl.[7] .................................................. F25B 21/02
(52) U.S. Cl. ........................................... 62/3.4; 62/93
(58) Field of Search .................................... 62/3.4, 93

(56) References Cited

U.S. PATENT DOCUMENTS

| | | | |
|---|---|---|---|
| 3,050,948 | * | 8/1962 | Jones ........................................ 62/3.4 |
| 4,499,736 | * | 2/1985 | Lieu et al. ................................. 62/3 |
| 4,586,342 | * | 5/1986 | Morishita et al. ......................... 62/3 |
| 5,444,984 | * | 8/1995 | Carson ...................................... 62/3.4 |
| 5,555,732 | * | 9/1996 | Whiticar .................................... 62/3.4 |
| 5,884,486 | * | 3/1999 | Hughes et al. ............................ 62/3.4 |
| 5,974,685 | * | 11/1999 | Hironaka .................................. 34/202 |
| 6,158,224 | * | 12/2000 | Hu et al. ................................... 62/3.4 |

* cited by examiner

Primary Examiner—William Doerrler
Assistant Examiner—Mark Shulman

(57) ABSTRACT

A dehumidifier has a main casing, a cover plate, a cool air fan, a hot air fan, two aluminum plates, a foamed plastics plate, a plurality of chiller chips, a rectifier, a temperature controller, a filter capacitor, and a voltage converter. The main casing has a round hole, a hot air vent, a plurality of water collecting apertures, two positioning plates, and an upper chamber. A cover is inserted in the round hole of the main casing. The hot air fan, the foamed plastics plate, and the aluminum plates are disposed in the main casing. Each aluminum plate has a plurality of radiation fins. The chiller chips are disposed on the aluminum plates.

3 Claims, 5 Drawing Sheets

DEHUMIDIFIER

BACKGROUND OF THE INVENTION

The present invention relates to a dehumidifier. More particularly, the present invention relates to a dehumidifier for an electronic device such as a computer without a compressor.

A chiller chip needs a transformer to increase a voltage so that an output power of the chiller chip will be increased.

SUMMARY OF THE INVENTION

An object of the present invention is to provide a dehumidifier which is disposed in an electronic device in order to dehumidify an interior of the electronic device without any compressor nor transformer.

Accordingly, a dehumidifier comprises a main casing, a cover plate, a cool air fan, a hot air fan, two aluminum plates, a foamed plastics plate, a plurality of chiller chips, a rectifier, a temperature controller, a filter capacitor, and a voltage converter. The cover plate is fastened on a main frame. The main casing has a round hole, a hot air vent formed on a top portion of the main casing, a plurality of water collecting apertures formed on a bottom of the main casing, two parallel positioning plates, and an upper chamber receiving the rectifier, the temperature controller, the filter capacitor, and the voltage converter. A cover is inserted in the round hole of the main casing. The hot air fan and the aluminum plates are disposed in the main casing. The foamed plastics plate is disposed between the aluminum plates. Each of the aluminum plates has a plurality of radiation fins. The chiller chips are disposed on the aluminum plates. Two temperature sensing rods are disposed on the aluminum plates.

DETAILED DESCRIPTION OF THE INVENTION

Figure 1:
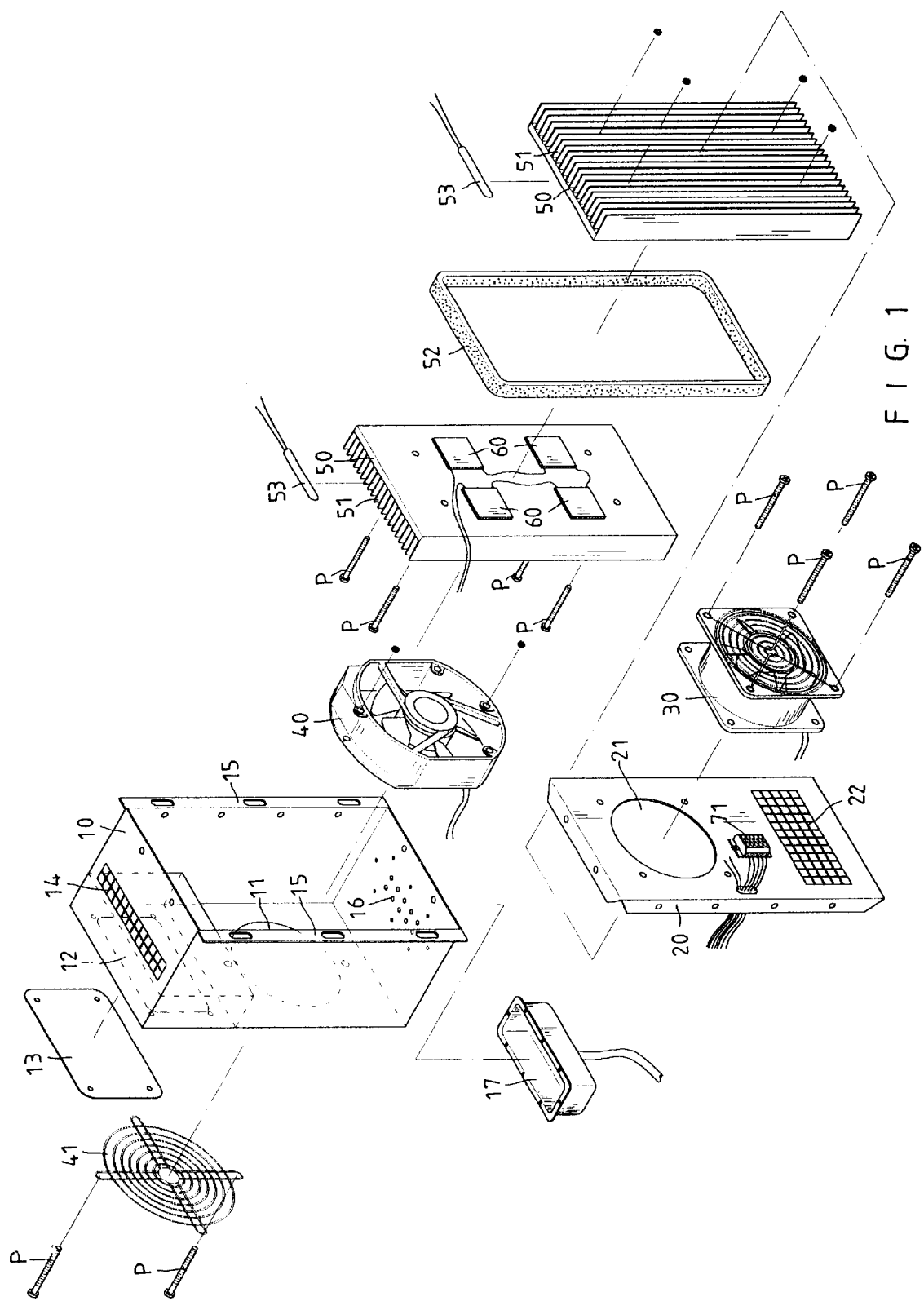
FIG. 1 is a perspective exploded view of a dehumidifier of a preferred embodiment in accordance with the present invention.
Figure 2:
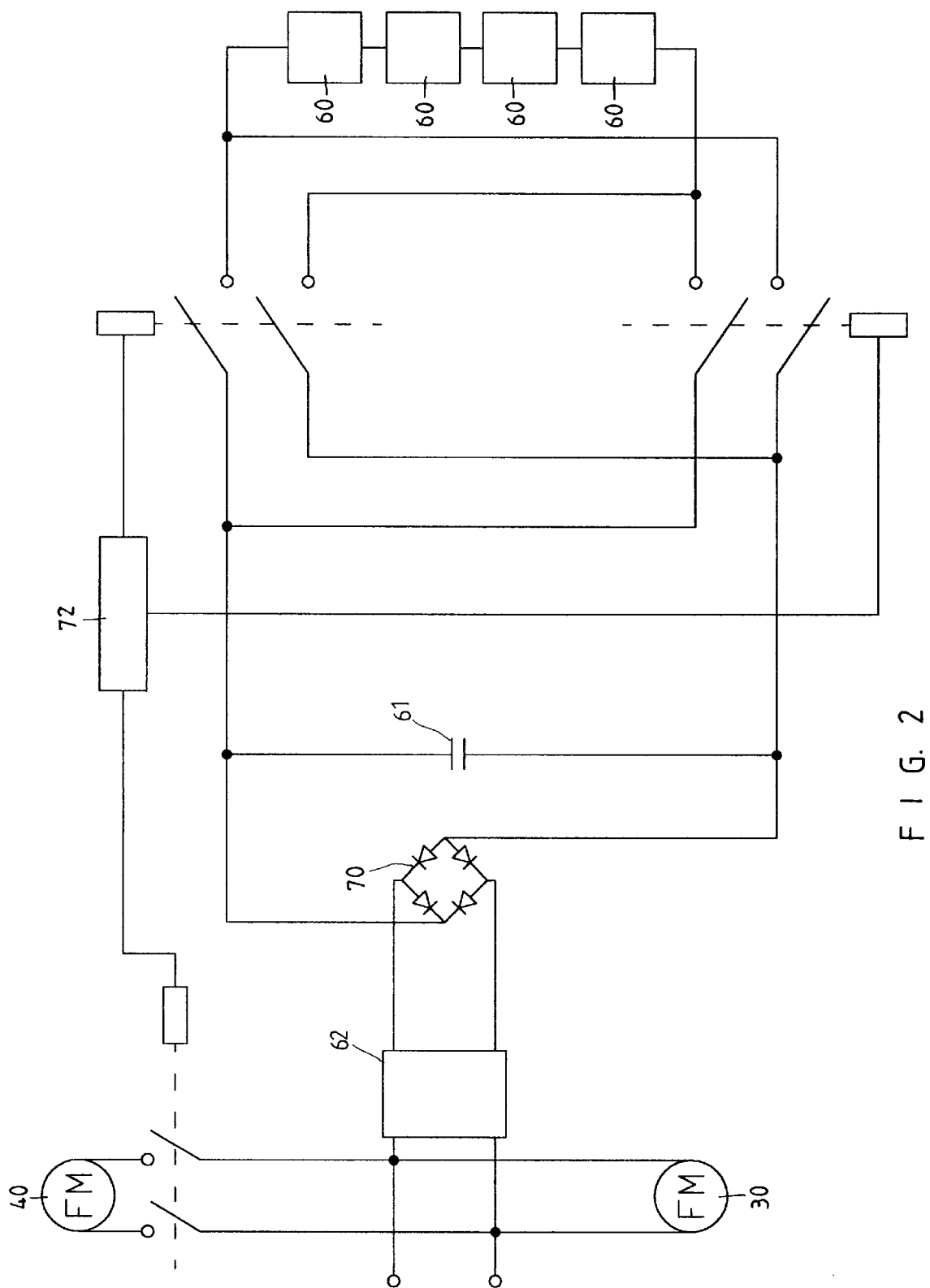
FIG. 2 is an electric schematic view of a dehumidifier of a preferred embodiment in accordance with the present invention.
Figure 3:
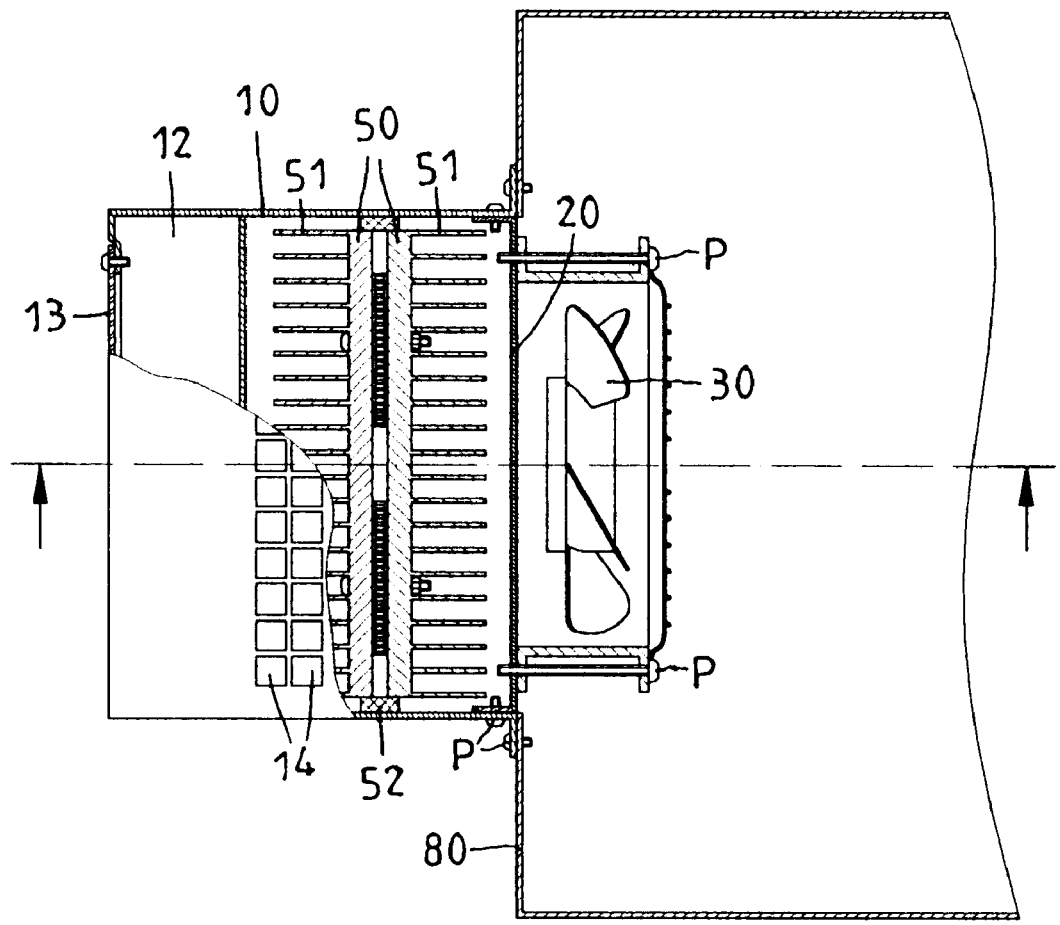
FIG. 3 is a first sectional schematic view showing an operation of a dehumidifier of a preferred embodiment in accordance with the present invention.
Figure 3A:
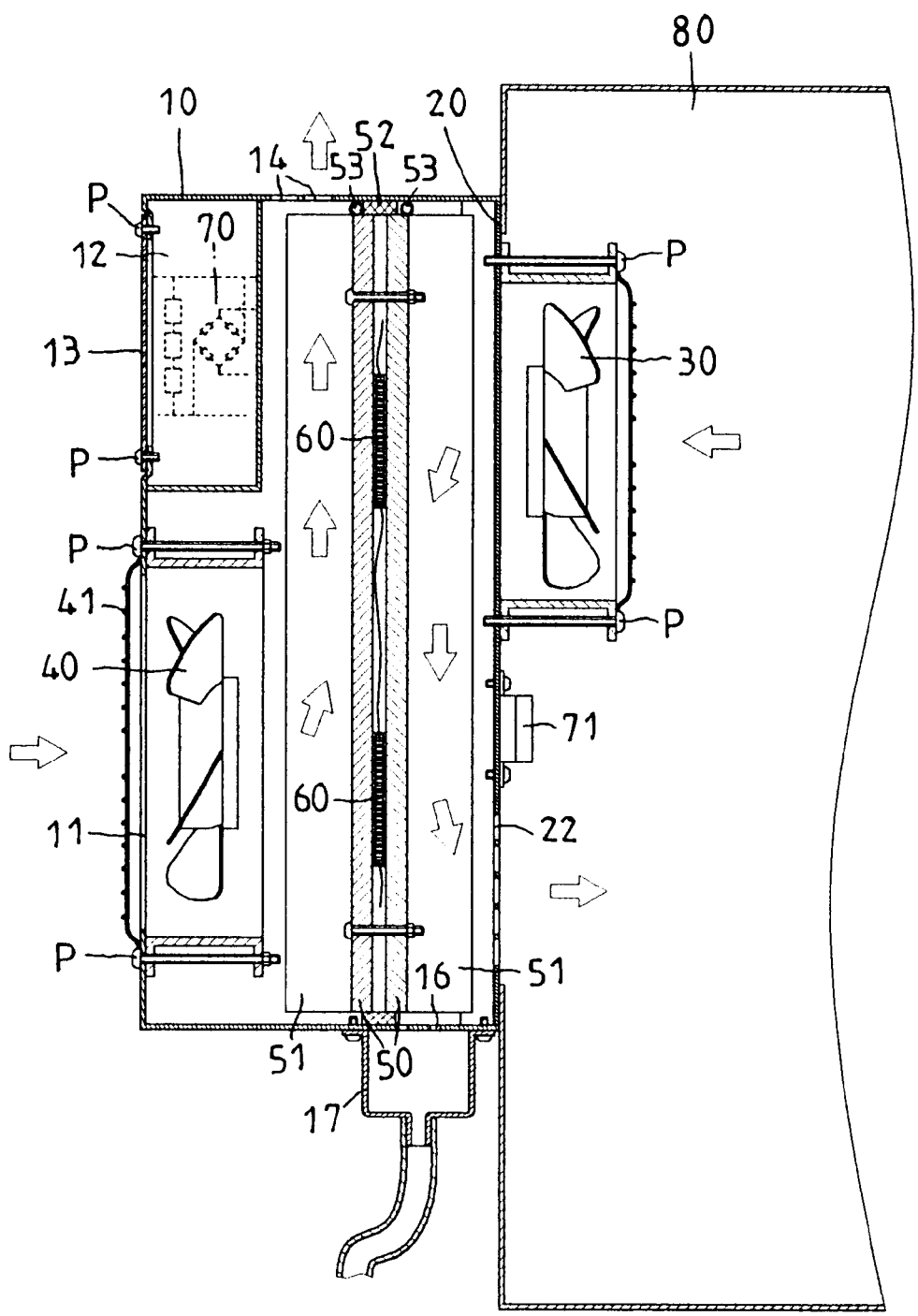
FIG. 3A is a second sectional schematic view showing an operation of a dehumidifier of a preferred embodiment in accordance with the present invention.
Figure 4:
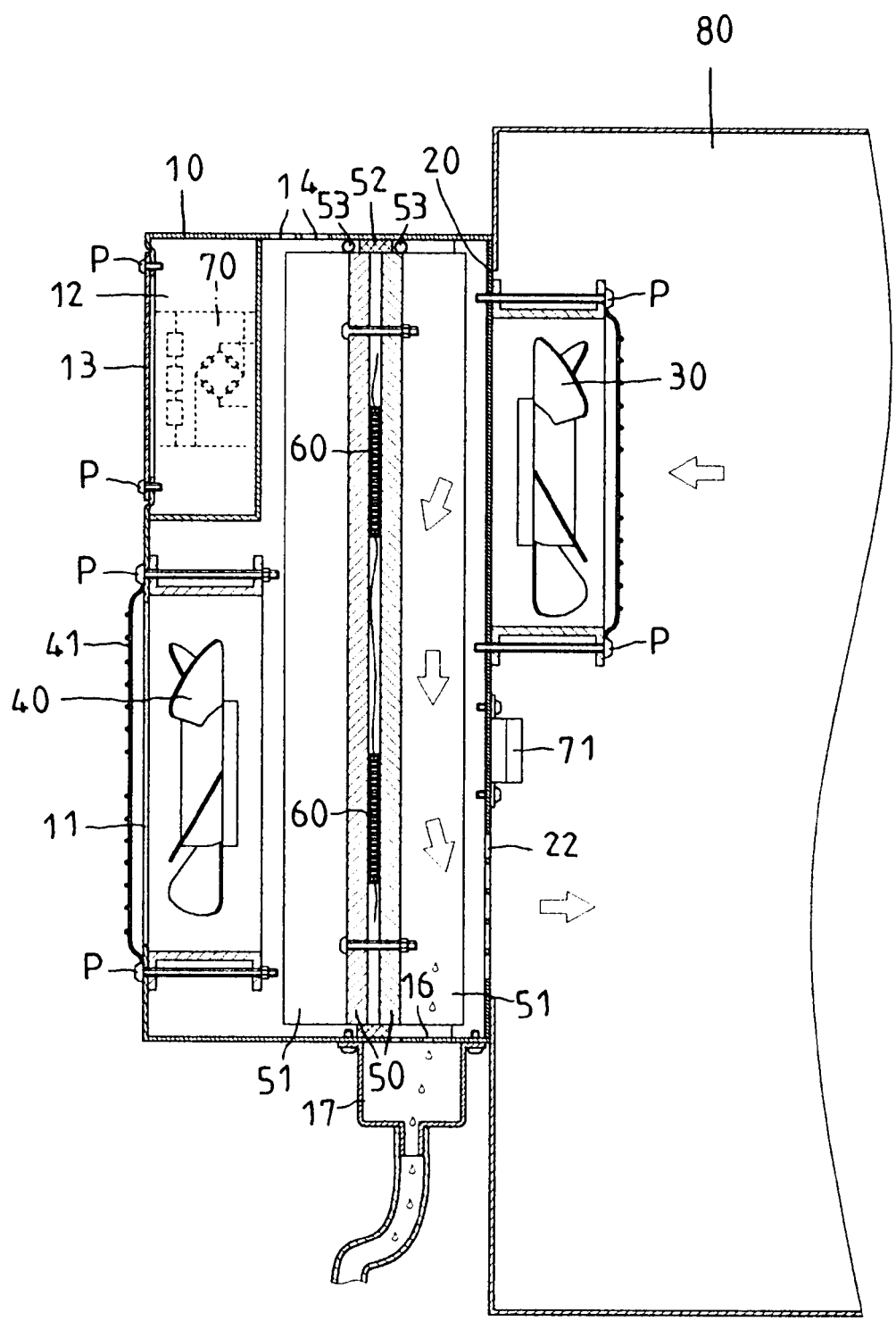
FIG. 4 is a sectional schematic view showing an application of a dehumidifier of a preferred embodiment in accordance with the present invention.

Referring to FIGS. 1 to 4, a dehumidifier comprises a main casing 10, a cover plate 20, a cool air fan 30, a hot air fan 40, two aluminum plates 50, a foamed plastics plate 52, a plurality of chiller chips 60, a rectifier 70, a temperature controller 72, a filter capacitor 61, and a voltage converter 62.

The cover plate 20 is fastened on a main frame 80.

The main casing 10 has a round hole 11, a hot air vent 14 formed on a top portion of the main casing 10, a plurality of water collecting apertures 16 formed on a bottom of the main casing 10, two parallel positioning plates 15, and an upper chamber 12 receiving the rectifier 70, the temperature controller 72, the filter capacitor 61, and the voltage converter 62.

A cover 41 is inserted in the round hole 11 of the main casing 10.

The hot air fan 40 and the aluminum plates 50 are disposed in the main casing 10.

The foamed plastics plate 52 is disposed between the aluminum plates 50.

Each of the aluminum plates 50 has a plurality of radiation fins 51.

The chiller chips 60 are disposed on the aluminum plates 50. Two temperature sensing rods 53 are disposed on the aluminum plates 50.

The cover plate 20 has a cool air vent 22 and a circular hole 21 receiving the cool air fan 30.

A socket 71 is disposed on the cover plate 20.

The cool air fan 30 and the cover plate 20 are fastened by bolts P.

A water collecting tank 17 is disposed on the bottom of the main casing 10.

An oblong plate 13 covers the upper chamber 12.

The invention is not limited to the above embodiment but various modification thereof may be made. Further, various changes in form and detail may be made without departing from the scope of the invention.

I claim:

1. A dehumidifier comprising:

a main casing, a cover plate, a cool air fan, a hot air fan, two aluminum plates, a foamed plastics plate, a plurality of chiller chips, a rectifier, a temperature controller, a filter capacitor, and a voltage converter, the main casing having a round hole, a hot air vent formed on a top portion of the main casing, a plurality of water collecting apertures formed on a bottom of the main casing, two parallel positioning plates, and an upper chamber receiving the rectifier, the temperature controller, the filter capacitor, and the voltage converter, a cover inserted in the round hole of the main casing, the hot air fan and the aluminum plates disposed in the main casing, the foamed plastics plate disposed between the aluminum plates, each of the aluminum plates having a plurality of radiation fins, the chiller chips disposed on the aluminum plates, two temperature sensing rods disposed on the aluminum plates, and the cover plate has a cool air vent and a circular hole receiving the cool air fan.

2. The dehumidifier as claimed in claim 1, wherein a water collecting tank is disposed on the bottom of the main casing.

3. The dehumidifier as claimed in claim 1, wherein an oblong plate covers the upper chamber.

* * * * *